United States Patent
Pandey et al.

(10) Patent No.: US 10,056,486 B2
(45) Date of Patent: Aug. 21, 2018

(54) METHODS FOR FIN THINNING PROVIDING IMPROVED SCE AND S/D EPI GROWTH

(71) Applicant: GLOBALFOUNDRIES Inc., Grand Cayman (KY)

(72) Inventors: Shesh Mani Pandey, Saratoga Springs, NY (US); Pei Zhao, Clifton Park, NY (US); Zhenyu Hu, Clifton Park, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 17 days.

(21) Appl. No.: 15/079,142

(22) Filed: Mar. 24, 2016

(65) Prior Publication Data

US 2017/0278965 A1 Sep. 28, 2017

(51) Int. Cl.
| | |
|---|---|
| H01L 29/78 | (2006.01) |
| H01L 29/66 | (2006.01) |
| H01L 29/08 | (2006.01) |
| H01L 29/161 | (2006.01) |
| H01L 29/16 | (2006.01) |
| H01L 29/165 | (2006.01) |
| H01L 29/24 | (2006.01) |
| H01L 29/267 | (2006.01) |

(52) U.S. Cl.
CPC ...... *H01L 29/7848* (2013.01); *H01L 29/0847* (2013.01); *H01L 29/161* (2013.01); *H01L 29/165* (2013.01); *H01L 29/1608* (2013.01); *H01L 29/24* (2013.01); *H01L 29/267* (2013.01); *H01L 29/66545* (2013.01); *H01L 29/66818* (2013.01); *H01L 29/7851* (2013.01)

(58) Field of Classification Search
CPC ............ H01L 29/7848; H01L 29/0847; H01L 29/161; H01L 29/1608; H01L 29/66818; H01L 29/24; H01L 29/267; H01L 29/7851; H01L 29/66545; H01L 29/165; H01L 29/785; H01L 29/66795
See application file for complete search history.

(56) References Cited

U.S. PATENT DOCUMENTS

| | | | | |
|---|---|---|---|---|
| 6,583,469 | B1* | 6/2003 | Fried | H01L 29/66818 257/327 |
| 7,915,693 | B2* | 3/2011 | Okano | H01L 29/66795 257/329 |
| 9,112,032 | B1* | 8/2015 | Liu | H01L 29/66795 |
| 9,178,067 | B1* | 11/2015 | Ching | H01L 29/0607 |
| 2005/0051825 | A1* | 3/2005 | Fujiwara | H01L 29/41733 257/308 |
| 2014/0151761 | A1* | 6/2014 | Hsieh | H01L 29/66545 257/288 |

\* cited by examiner

*Primary Examiner* — Michael Trinh
(74) *Attorney, Agent, or Firm* — Ditthavong & Steiner, P.C.

(57) ABSTRACT

Methods to reduce a width of a channel region of Si fins and the resulting devices are disclosed. Embodiments include forming a Si fin in a Si layer; forming a channel region over the Si fin including a dummy gate with a spacer on each side; forming S/D regions at opposite ends of the Si fin; removing the dummy gate, forming a cavity; thinning sidewalls of the Si fin; and forming a high-k/metal gate in the cavity.

8 Claims, 8 Drawing Sheets

FIG. 1A
BACKGROUND

FIG. 1B
BACKGROUND

METHODS FOR FIN THINNING PROVIDING IMPROVED SCE AND S/D EPI GROWTH

TECHNICAL FIELD

The present disclosure relates generally to designing and fabricating integrated circuit (IC) devices. The present disclosure is particularly applicable to forming silicon (Si) fins with improved short-channel performance and source/drain (S/D) formation in FinFET IC devices.

BACKGROUND

With advancements in design and fabrication processes of IC devices, semiconductor manufacturers are able to increase the component density in integrated circuits and deliver smaller scaled IC devices that provide benefits such as improved performance, reduced power consumption, lower cost, etc. for a target product. Fabrication of the components in such devices may require smaller circuit elements, for example, interconnects, conductive lines, contacts, resistors, and the like. In some instances, a reduction in the size of a circuit element may be beneficial in some aspects while limiting in others. For example, in a FinFET device, a width of a Si fin may be based on a required/desired short-channel performance (e.g. better with a narrow width) while the same width may negatively impact formation and characteristics of S/D regions in the Si fin leading to undesired performance issues.

Figure 1A:
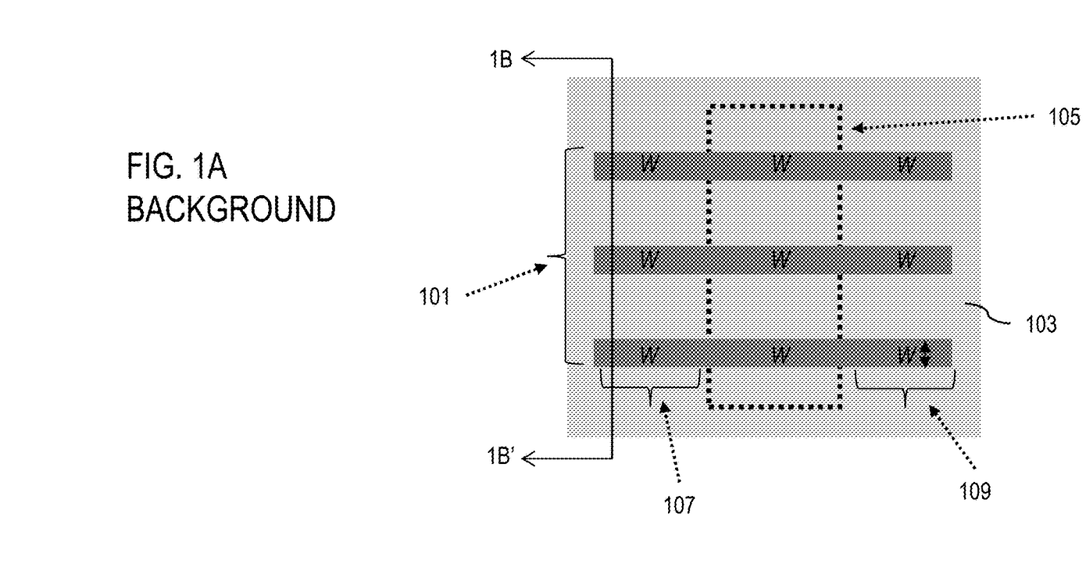
FIGS. 1A and 1B illustrate a top view of example Si fins and a cross-sectional view of the Si fins with epi growth, respectively.

FIG. 1A illustrates a top view of example Si fins 101, in a substrate 103, with a uniform width W across a gate/channel region 105, and S/D regions 107 and 109. As mentioned, the width W may be optimized to improve short-channel effects (SCE) in the channel region, wherein a narrower width can provide for a better short-channel performance. However, a narrower fin width may hinder formation of an optimum S/D epi width; thus, impacting drive current of the device.

Figure 1B:
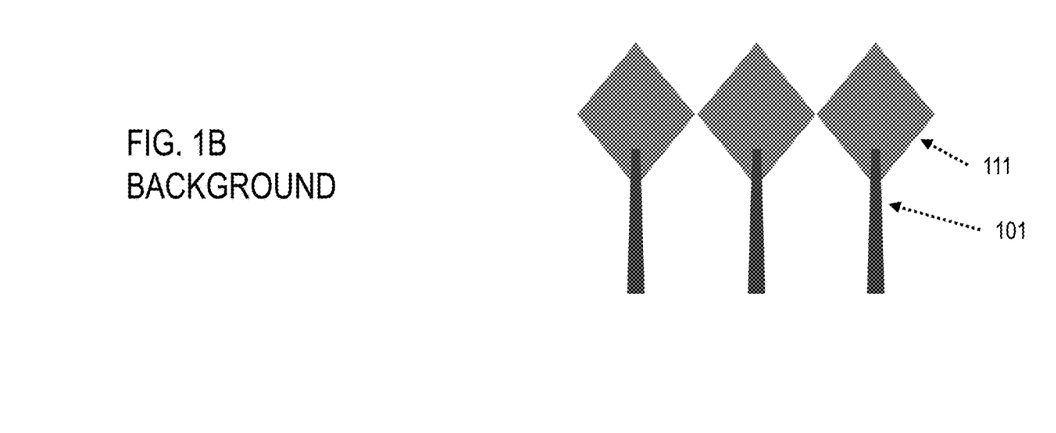

FIG. 1B illustrates a cross-sectional view of the source 107 (or drain 109) regions along a cross-sectional reference line 1B-1B'. In FinFET devices, one or more epitaxy processes may be utilized to increase the size of fin sections in the S/D regions 107/109 where semiconductor material 111 (e.g., Si, silicon-germanium) may be grown/deposited (epi growth) on and around the fins in the S/D regions. The epi growths 111 on the fins may help to reduce electrical resistance in the S/D regions, provide larger areas for electrical contacts to the S/D regions, and provide additional physical support/strength for the fins. However, a volume of an epi growth 111 may be limited by the width of a fin 101.

Therefore, a need exists for methodology enabling formation of a Si fin with different widths and the resulting devices.

SUMMARY

An aspect of the present disclosure is a method for thinning a channel region of a Si fin in a FinFET device.

An aspect of the present disclosure is a FinFET device including Si fins with different widths along each Si fin.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure some technical effects may be achieved in part by a method including forming a Si fin in a Si layer; forming a channel region over the Si fin including a dummy gate with a spacer on each side; forming S/D regions at opposite ends of the Si fin; removing the dummy gate, forming a cavity; thinning sidewalls of the Si fin within the cavity; and forming a high-k/metal gate in the cavity.

Another aspect includes forming a plurality of Si fins, parallel to and spaced from each other, in the Si layer; and for each Si fin: in a channel region over the Si fin, forming a dummy gate with a spacer on each side; forming S/D regions at opposite ends of the Si fin; removing the dummy gate, forming a cavity; thinning sidewalls of the Si fin within the cavity; and forming a high-k/metal gate in the cavity.

One aspect includes thinning by etching. An additional aspect includes oxidizing an outer layer of each sidewall; and removing the oxidized layer.

One aspect includes thinning the sidewalls based on criteria to control short-channel effects. Another aspect includes thinning each sidewall by 2-20% of a width of each Si fin. A further aspect includes thinning each sidewall by 0.5-3 nm.

An additional aspect includes forming the S/D regions by epitaxially growing a layer of silicon-germanium at the opposite ends of each Si fin. One aspect includes forming the S/D regions by epitaxially growing a layer of doped-silicon at the opposite ends of each Si fin.

Another aspect of the present disclosure includes a device including: a Si fin in a Si layer; S/D regions at opposite ends of the Si fin; and a high-k/metal gate in a channel region over the Si fin, wherein the Si fin in the channel region has a narrower width than widths of other regions of the Si fin.

A further aspect includes a plurality of Si fins, parallel to and spaced from each other, in the Si layer; S/D regions at opposite ends of each Si fin; and a high-k/metal gate in a channel region over each Si fin, wherein each Si fin in the channel region has a narrower width than widths of other regions of the Si fin.

An additional aspect includes a width of each Si fin in the channel region being based on short-channel performance criteria.

In another aspect, the width of each Si fin in the channel region is 2-20% narrower than widths of other regions of each Si fin.

In an additional aspect, the width of each Si fin in the channel region is 0.5-3 nm narrower than widths of other regions of each Si fin.

A further aspect includes the S/D regions including epitaxially grown silicon-germanium (eSiGe). Another aspect includes the S/D regions including epitaxially grown doped-silicon.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which:

FIGS. 2A, 2E, and 2G illustrate top views.

DETAILED DESCRIPTION

For the purposes of clarity, in the following description, numerous specific details are set forth to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses the problems of insufficient SCE control or small epitaxial growth area for S/D regions attendant upon Si fins having a constant width. The present disclosure addresses and solves such problems, for instance, by, inter alia, removing a layer from sidewalls of a fin in a gate/channel area based on criteria for controlling SCE.

Figure 2A:
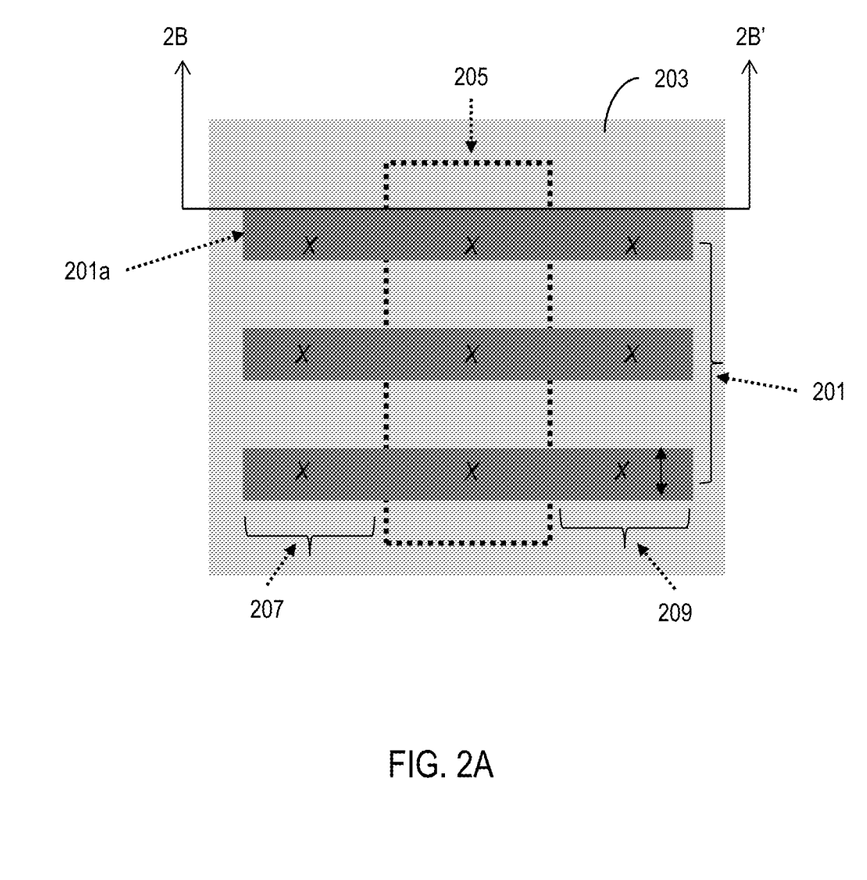

FIG. 2A illustrates a top view of parallel Si fins 201 formed (e.g. by conventional FinFET device fabrication processes) on a Si layer 203, wherein the quantity and spacing of the fins may depend on fabrication processes and a design of a target IC device. Different sections/regions of the fins 201 may be utilized to provide different functionality in a circuit element such as a transistor. A channel region 205 may be utilized to implement a gate structure for controlling a flow of electrical current between S/D regions 207 and 209 at opposite end of the fins. Each fin may have a substantially same fin width X across the channel and S/D regions. Cross-sectional reference line 2B-2B' will be used to provide cross-sectional views in below figures and discussions.

Figure 2B:
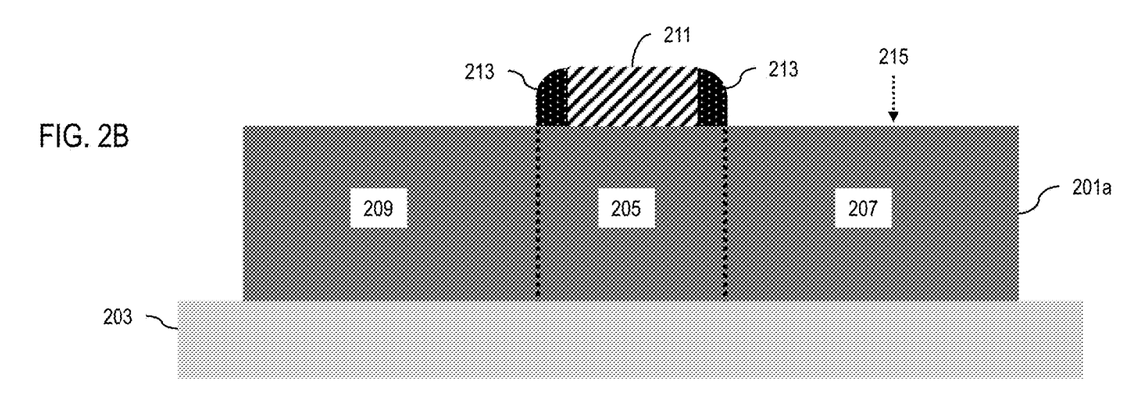
FIGS. 2B through 2D, 2F, and 2H illustrate cross-sectional views, of processes for thinning sections of Si fins, in accordance with an exemplary embodiment.
Figure 2C:
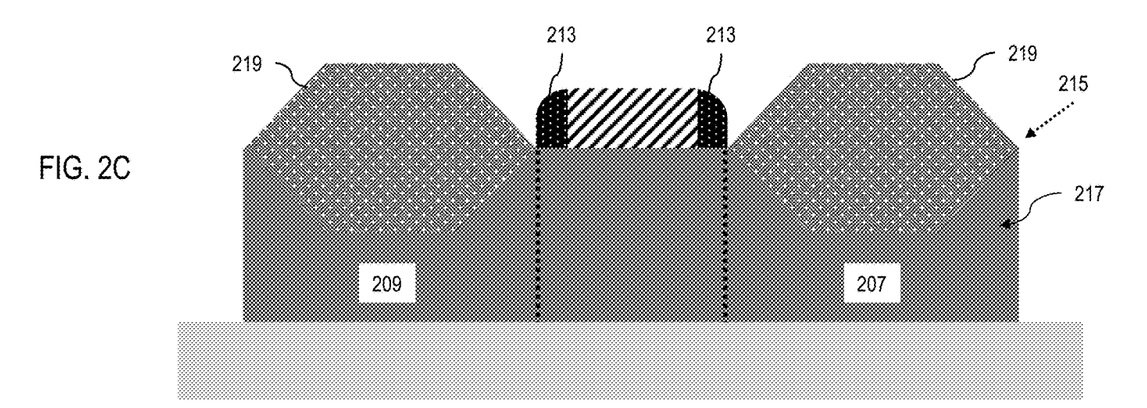

FIG. 2B illustrates a cross-sectional view of a fin 201a along the reference line 2B-2B'. Although in some of the figures and discussions below only one fin may be referred to and/or illustrated, the processes discussed may be applied to the other fins as well. In the channel region 205, a dummy gate structure including a dummy gate 211 (e.g. of polysilicon) over an oxide layer (not shown for illustrative convenience) and with a spacer 213 on each side may be formed on an upper surface 215 of the fin 201a. In FIG. 2C, semiconductor material 219 may be epitaxially grown on the upper surface 215 and sidewalls 217 of the fin 201a, at the opposite ends of the fin in the S/D regions 207 and 209. The semiconductor material 219 may include eSiGe for a p-type device (e.g. PMOS) and doped-silicon for an n-type device (e.g. NMOS).

Figure 2D:
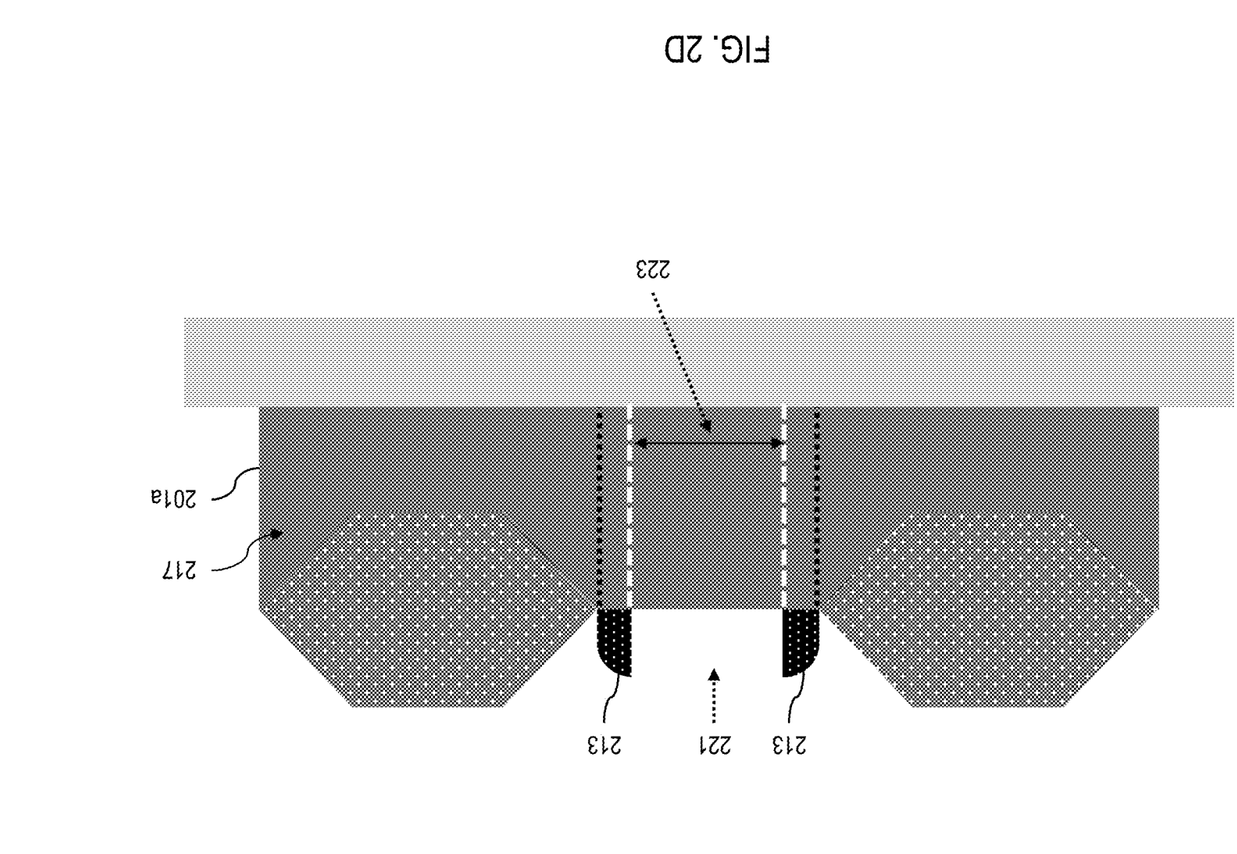

As illustrated in FIG. 2D, the dummy gate 211 and underlying oxide are removed (by conventional processes) to create a cavity 221, over the fin 201a, in a gate area 223 between the spacers 213. One or more processes may be utilized to thin/remove a layer from each sidewall of the fin in the gate area 223.

Figure 2E:
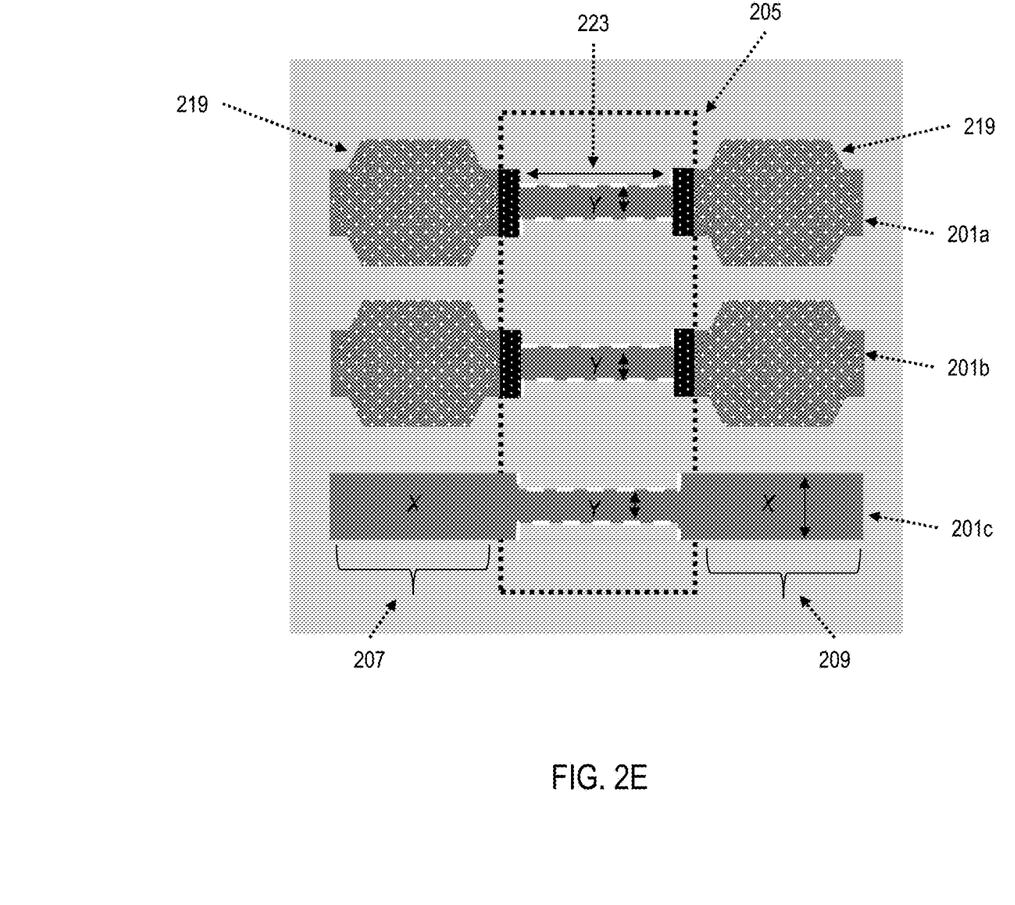

FIG. 2E, illustrates a top view of the fins 201 including fins 201a, 201b, and 201c. Fin 201c is illustrated without the semiconductor material 219 for illustrative convenience to further illustrate a narrower/thinned width Yin the gate area 223 of the channel region 205 while the S/D regions 207 and 209 maintain the same prior width X The fins 201a/201b include the same configuration as fin 201c, but with the semiconductor material 219 in the S/D regions 207 and 209. As illustrated, the width Y may be achieved by thinning both sidewalls in the gate area 223 of each fin. For instance, an etching process may be used to remove a layer of Si from a surface of the sidewall 217. Alternatively, the surface of each sidewall may be oxidized and then the oxidized layer may be removed. A target width of a fin in the gate area may be based on criteria to control short-channel effects. For example, a sidewall in the gate area 223 may be thinned/recessed by 2-20% of a width of the fin, or each sidewall in the gate area may be thinned by 0.5-3 nm.

Figure 2F:
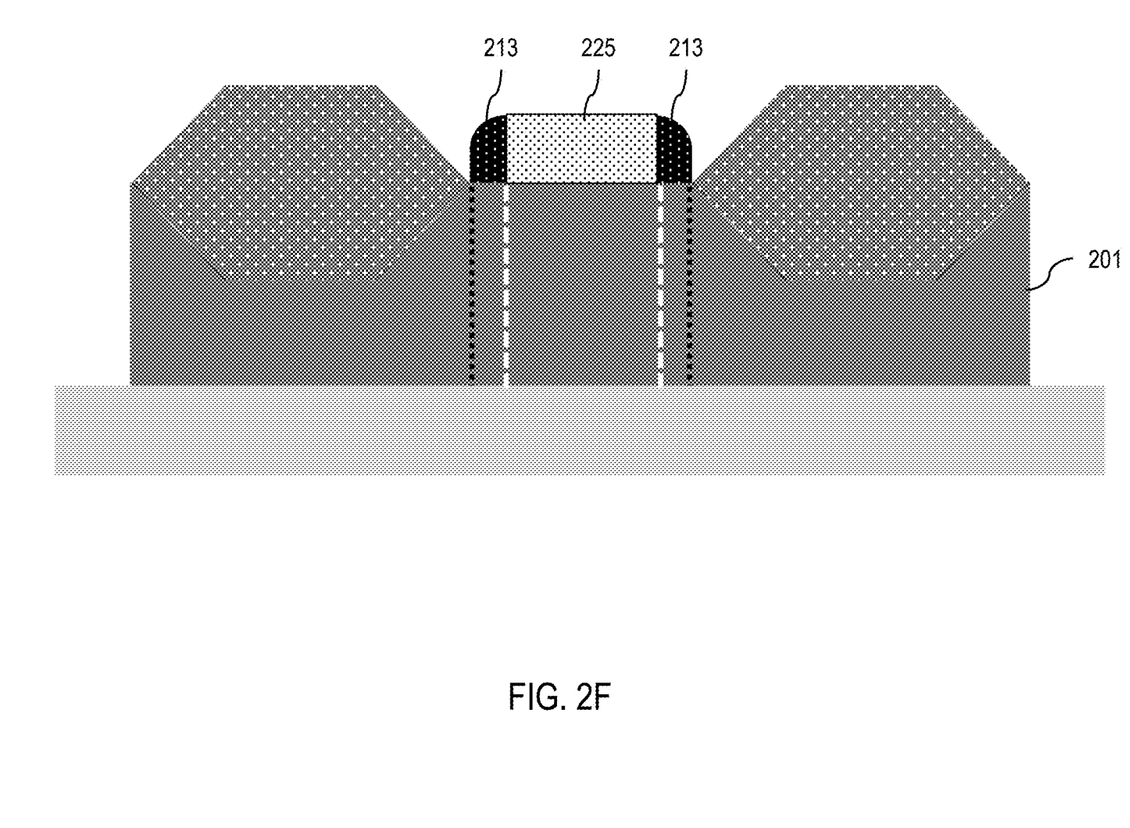
Figure 2G:
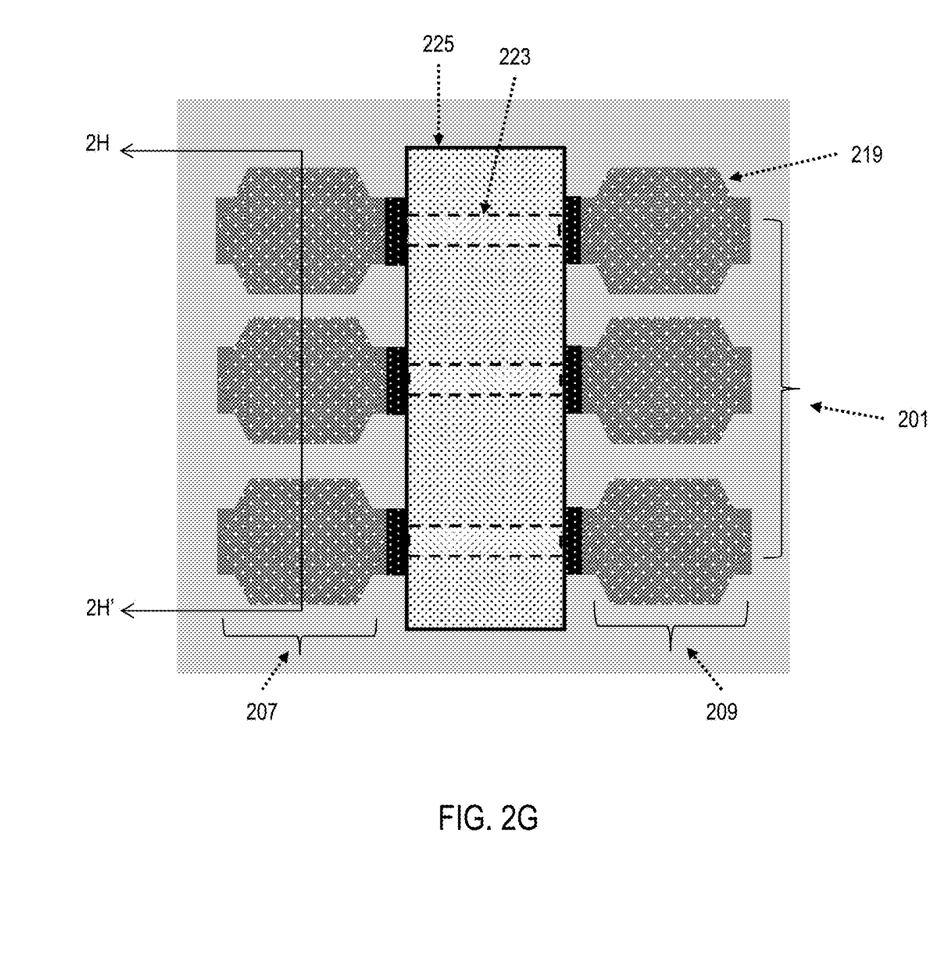

In FIG. 2F, a high-k/metal gate 225 may be formed in the cavity 221, of FIG. 2D, followed by conventional processes (e.g. forming an interlayer dielectric layer over the fins) to complete the fabrication of the IC device. The high-k/metal gate 225 may be formed by depositing an interfacial layer (e.g. an oxide) and a high-k dielectric layer, followed by depositing one or more work function metal layers and filling a remainder of the cavity 221 with metal. The high-k metal gate 225 may be formed across all of the fins. FIG. 2G illustrates a top view of the fins including a high-k/metal gate 225 over the narrower gate area 223 of each fin to improve the SCE while the wider sections of the fins in the S/D regions 207 and 209 support the formation of better (e.g. more volume) S/D epi material 219. A cross-sectional reference line 2H-2H' will be used to provide a cross-sectional view in FIG. 2H.

Figure 2H:
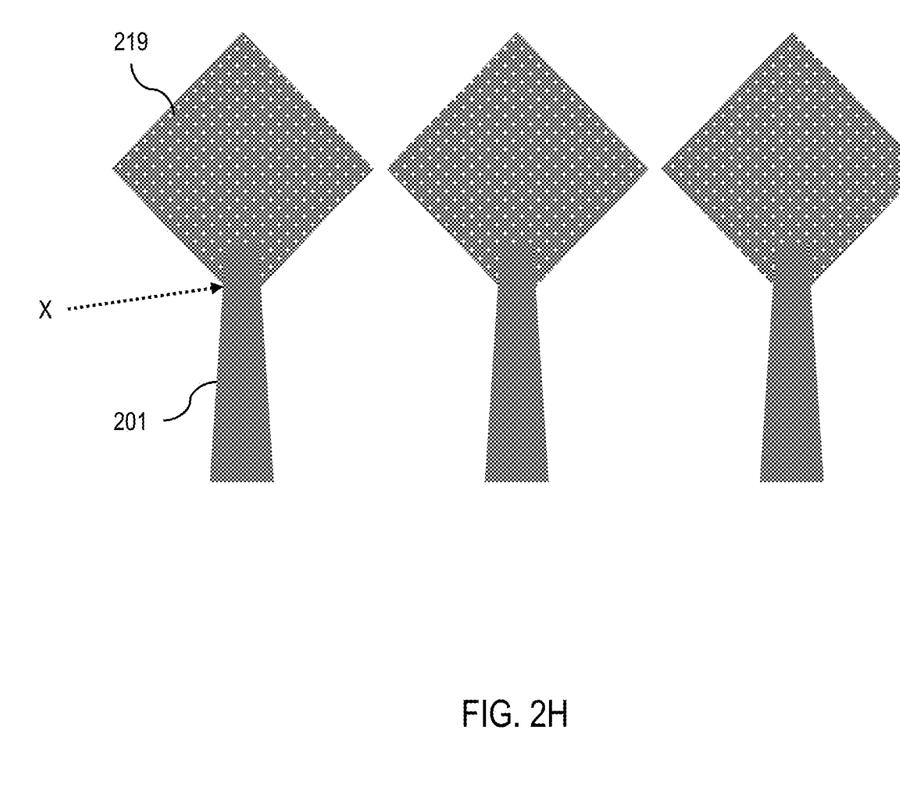

In FIG. 2H, a cross-sectional view along the reference line 2H-2H' illustrates the fins 201 and the epi growth 219 on each fin. As noted, a wider width, X, of the fins 201 can support a larger volume of epi growth 219 in the S/D regions of the fins.

The embodiments of the present disclosure can achieve several technical effects including a larger eSiGe volume for the S/D regions concurrently with improved SCE control, thereby improving transistor performance (for example by about 2.7% per nanometer). This approach provides the advantages of independent optimization of the epi volume in the S/D regions on wider fin widths (e.g. providing more drive current), and a thinner fin width in a channel area (e.g. for better SCE). Furthermore, the embodiments enjoy utility in various industrial applications as, for example, microprocessors, smart phones, mobile phones, cellular handsets, set-top boxes, DVD recorders and players, automotive navigation, printers and peripherals, networking and telecom equipment, gaming systems, digital cameras, or other devices utilizing logic or high-voltage technology nodes. The present disclosure therefore enjoys industrial applicability in any of various types of highly integrated semiconductor devices, including devices that use SRAM cells (e.g., liquid crystal display (LCD) drivers, digital processors, etc.)

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
forming a plurality of Si fins, parallel to and spaced from each other, in a Si layer;
forming a channel region over each Si fin including a dummy gate with a spacer on each side;
forming source/drain regions (S/D) by epitaxially growing a layer of a combination of silicon-germanium and doped-silicon on each side of the dummy gate, each Si fin having a substantially same fin width X across the channel and the S/D regions;
removing the dummy gate, forming a cavity;
thinning sidewalls of each Si fin within the cavity by oxidizing an outer layer of each sidewall and etching the oxidized layer, such that a width of each Si fin in the channel region is less than X, the width of each Si fin being measured in a direction perpendicular to a length direction of each Si fin and in a plane parallel to a top surface of each Si fin; and
forming a high-k/metal gate in the cavity.

2. The method according to claim 1, further comprising:
for each Si fin:
in a channel region over the Si fin, forming a dummy gate with a spacer on each side;
forming S/D regions at opposite ends of the Si fin;
removing the dummy gate, forming a cavity;
thinning sidewalls of the Si fin within the cavity; and
forming a high-k/metal gate in the cavity.

3. The method according to claim 2, comprising:
thinning the sidewalls based on criteria to control short-channel effects.

4. The method according to claim 2, comprising:
thinning each sidewall by 2-20% of a width of each Si fin.

5. The method according to claim 2, comprising:
thinning each sidewall by 0.5-3 nm.

6. A method comprising:
forming a plurality of silicon (Si) fins, parallel to and spaced from each other, in a Si layer; and
for each fin:
in a channel region over the Si fin, forming a dummy gate with a spacer on each side;
forming source/drain regions (S/D) by epitaxially growing a layer of a combination of silicon-germanium and doped-silicon on each side of the dummy gate, the Si fin having a substantially same fin width X across the channel and the S/D regions;
removing the dummy gate, forming a cavity;
thinning sidewalls of the Si fin within the cavity by oxidizing an outer layer of each sidewall and etching the oxidized layer, such that a width of Si fin in the channel region is less than X, the width of the Si fin being measured in a direction perpendicular to a length direction of the Si fin and in a plane parallel to a top surface of the Si fin, by etching or by oxidizing an outer layer of each sidewall and removing the oxidized layer, the thinning based, at least in part, on criteria to control short-channel effects; and
forming a high-k/metal gate in the cavity.

7. The method according to claim 6, comprising:
thinning a sidewall of each Si fin within the cavity by 2-20% of a width of the Si fin.

8. The method according to claim 6, comprising:
thinning a sidewall of each Si fin within the cavity by 0.5-3 nm.

* * * * *